United States Patent [19]

Fujinuma et al.

[11] Patent Number: 4,898,839
[45] Date of Patent: Feb. 6, 1990

[54] SEMICONDUCTOR INTEGRATED CIRCUIT AND MANUFACTURING METHOD THEREFOR

[75] Inventors: Chikao Fujinuma; Nobuyuki Sekikawa; Teruo Tabata; Tadayoshi Takada; Yoshiaki Sano; Toshimasa Sadakata, all of Gunma, Japan

[73] Assignee: Sanyo Electric Co., Ltd., Osaka, Japan

[21] Appl. No.: 271,746

[22] Filed: Nov. 15, 1988

[51] Int. Cl.$^4$ .............................................. H01L 27/04
[52] U.S. Cl. ......................................... 437/33; 437/47; 437/919; 437/75; 437/31; 437/60; 148/DIG. 14; 357/51
[58] Field of Search ...................... 437/33, 47, 919, 60, 437/31, 46; 148/DIG. 14; 357/51, 34

[56] References Cited

U.S. PATENT DOCUMENTS

| | | | |
|---|---|---|---|
| 4,377,029 | 3/1983 | Ozawa | 437/919 |
| 4,505,766 | 3/1985 | Nagumo et al. | 357/51 |
| 4,633,291 | 12/1986 | Koyama | 357/51 |
| 4,732,872 | 3/1988 | Komatsu | 437/47 |

Primary Examiner—Brian E. Hearn
Assistant Examiner—Tuan Nguyen
Attorney, Agent, or Firm—Darby & Darby

[57] ABSTRACT

A method of manufacturing a semiconductor integrated circuit comprises the steps of: forming an epitaxial layer covering a semiconductor substrate and buried layers; forming isolation regions dividing the epitaxial layer into a plurality of islands; forming a lower electrode region of an MIS type capacitor in one of the islands; forming a base region of a vertical bipolar transistor simultaneously with or independently from the lower electrode in another island; depositing a thin dielectric layer of the MIS type capacitor on a portion of the lower electrode region; thereafter selectively diffusing impurities into the surface layer of the base region so as to form an emitter region of the vertical bipolar transistor; and forming an upper electrode of the MIS type capacitor on the thin dielectric layer.

8 Claims, 9 Drawing Sheets

SEMICONDUCTOR INTEGRATED CIRCUIT AND MANUFACTURING METHOD THEREFOR

BACKGROUND OF THE INVENTION

1. Field of the Invention

The present invention relates to a semiconductor IC (Integrated Circuit) comprising a bipolar transistor and a MIS (Metal Insulator Semiconductor) type capacitor, and to a manufacturing method therefor. More specifically, it relates to accurate control of a current amplification factor $h_{FE}$ of the bipolar transistor.

2. Description of the Background Art

Generally, a bipolar type semiconductor IC comprises a vertical npn transistor. In manufacturing an npn transistor, a base region is formed by impurity diffusion in a surface layer of a collector region and an emitter region is formed by impurity diffusion in a surface layer of the base region. Namely, the steps of forming the base and the emitter by diffusion are indispensable and fundamental in manufacturing a bipolar type semiconductor IC. The step of forming a buried layer having high impurity concentration for reducing collector resistance, the step of growing an epitaxial layer, the step of forming junction isolating regions for isolating circuit elements from each other, the step of forming electrodes for electrical connections and so on are also indispensable and fundamental in manufacturing the bipolar type semiconductor IC.

In many cases, a pnp transistor, a register, a capacitor, a Zener diode and so on as well as the npn transistor are desired to be formed on the same substrate of a bipolar type semiconductor IC. Preferably, these circuit elements are desired to be simultaneously formed in any of the above mentioned fundamental steps, in order to avoid complication of the manufacturing process. However, various conditions for the above mentioned fundamental manufacturing steps are selected to provide the best characteristics of the npn transistor, and therefore it is difficult to incorporate other circuit elements simultaneously through the fundamental manufacturing steps. Consequently, new steps are added to the above mentioned fundamental manufacturing steps in order to form circuit elements other than the npn transistor, or to enhance tee characteristics of such circuit elements.

Examples of the additional steps are: a step of p+ diffusion for forming an anode region of a Zener diode in addition to a cathode region which was formed simultaneously with the emitter of the npn transistor in the same step of diffusion; a step of diffusion or ion implantation for forming a resistor region having a specific resistance different from the base region of the npn transistor; a step of forming a nitride layer as a dielectric layer for a capacitor having a larger capacitance than a MOS (Metal Oxide Semiconductor) type capacitor; and a step of forming a collector low resistance region for reducing the collector resistance of the npn transistor. These additional steps are optional steps which are adopted on taking into consideration the use, purpose, or manufacturing cost of the bipolar type IC.

Figure 1:
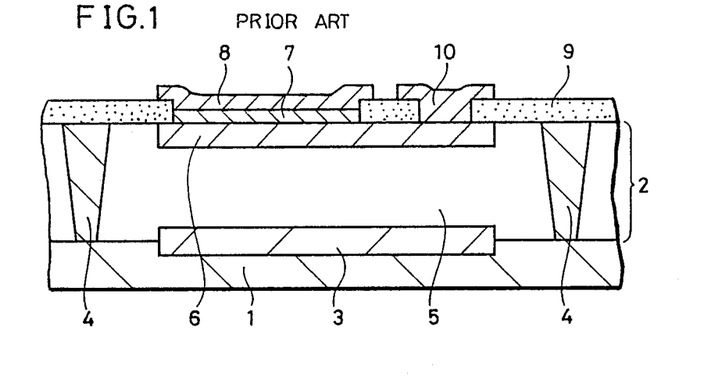
FIG. 1 is a cross sectional view schematically showing a MIS type capacitor formed in accordance with the prior art.

Referring to FIG. 1, a MIS type capacitor formed by utilizing one of the above mentioned optional steps is shown in a schematic sectional view. An n+ type buried layer 3 is formed on a p type semiconductor substrate 1. The substrate 1 and the buried layer 3 are covered with an n type epitaxial layer 2. The epitaxial layer 2 is divided into islands 5, on which the circuit elements are formed by p+ isolating regions 4. An n+ type lower electrode region 6 of the capacitor is formed simultaneously with an emitter of an npn transistor in the same step of impurity diffusion. The epitaxial layer 2 is covered with a silicon oxide layer 9. A silicon nitride layer 7 having a large dielectric constant is formed in an opening of the silicon oxide layer 9 on the lower electrode region 6. An aluminum layer 8 is formed on the nitride layer 7 as an upper electrode of the capacitor, and an aluminum connection 10 is formed, which is connected to the lower electrode region 6 through a contact hole of the oxide layer 9.

As described above, the n+ lower electrode region 6 of the MIS type capacitor of the prior art is formed simultaneously in the same step of forming the emitter region of the npn transistor. In other words, the nitride layer 7 is deposited after n type impurities have been applied in predetermined regions on the epitaxial layer, and thereafter, the n type impurities are driven in by diffusion so as to form the emitter region and the lower electrode region 6. However, the n type impurities are unintentionally diffused to some extent, at a temperature of about 800° C. at which the nitride layer 7 is deposited, before the impurities are driven in. Namely, the emitter region is influenced by the temperature for depositing the nitride layer 7, and therefore accurate control of the current amplification factor $h_{FE}$ of the npn transistor is difficult.

The conditions for thermal treatment for forming the emitter region must be changed dependent on whether or not the optional step is employed for forming the nitride layer. Namely, when a semiconductor IC is manufactured utilizing optional steps, various conditions for the above mentioned fundamental steps must also be changed.

SUMMARY OF THE INVENTION

In view of the prior art, an object of the present invention is to provide a semiconductor IC comprising a bipolar transistor and a MIS type capacitors, in which the current amplification factor $h_{FE}$ of the bipolar transistor can be controlled, and to provide a manufacturing method therefor.

In accordance with one aspect of the present invention, a method for manufacturing a semiconductor IC comprises the steps of: preparing a semiconductor substrate of a first conductivity type; forming buried layers of a second conductivity type on desired regions of the substrate; forming an epitaxial layer of the second conductivity type over the substrate and the buried layers; forming isolation regions of the first conductivity type which divides the epitaxial layer into a plurality of islands; forming a lower electrode region of the first conductivity type or of the second conductivity type of a MIS type capacitor in a surface layer of one of the islands; forming a base region of the first conductivity type of a vertical bipolar transistor in a surface layer of another island simultaneously with or independently from the lower electrode region; covering the surface of the epitaxial layer with an oxide layer; exposing a portion of the lower electrode region by patterning the oxide layer and depositing a thin dielectric layer of the MIS type capacitor; further patterning the oxide layer and selectively diffusing impurities of the second conductivity type into the epitaxial layer so as to form an emitter region of the vertical bipolar transistor; forming an upper electrode of the MIS type capacitor on the thin dielectric layer and forming a connection to the lower electrode region through a contact hole provided on the oxide layer.

According to another aspect of the present invention, a method for manufacturing a semiconductor IC comprises the steps of: preparing a semiconductor substrate of a first conductivity type; forming buried layers of a second conductivity type on desired regions of the substrate; forming an epitaxial layer of the second conductivity type over the substrate and the buried layers; forming isolation regions of the first conductivity type dividing the epitaxial layer into a plurality of islands, and simultaneously forming a lower electrode region of a MIS type capacitor in one of the islands; selectively introducing impurities of the first conductivity type into a surface layer of another island to form a base region of a vertical bipolar transistor; covering the epitaxial layer with an oxide layer; patterning the oxide layer to expose a portion of the lower electrode region and depositing a thin dielectric layer of the MIS capacitor; and further patterning the oxide layer and selectively diffusing impurities of the second conductivity type to form an emitter region of the vertical bipolar transistor.

According to a further aspect of the present invention, a semiconductor IC comprises: a semiconductor substrate of a first conductivity type; buried layers of a second conductivity type formed on prescribed regions of the substrate; an epitaxial layer of the second conductivity type formed covering the substrate and the buried layers; isolation regions of the first conductivity type formed to divide the epitaxial layer into a plurality of islands; a lower electrode layer of a MIS type capacitor formed on one of the islands simultaneously with the isolating regions, extending from the top surface of the one of the islands to corresponding one of the buried layers; a base region of a vertical bipolar transistor formed in a surface layer of another island by selectively introducing impurities of the first conductivity type; a thin dielectric layer formed on the lower electrode region of the MIS type capacitor; and an emitter region formed in a surface layer of the base region of the vertical bipolar transistor; and an upper electrode formed on the thin dielectric layer of the MIS type capacitor.

According to a still further aspect of the present invention, a method for manufacturing a semiconductor IC comprises the steps of: preparing a semiconductor substrate of a first conductivity type; forming buried layers of a second conductivity type on desired region of the substrate; forming an epitaxial layer of the second conductivity type so as to cover the substrate and the buried layers; forming isolation regions of the first conductivity type dividing the epitaxial layer into a plurality of islands and simultaneously forming a lower electrode region of a MIS type capacitor in one of the islands; removing a thick thermal oxide layer, which has been inevitably formed on the epitaxial layer at the time of forming the isolation regions, to expose the epitaxial layer, and again forming a thin thermal oxide layer on the epitaxial layer; implanting ions of impurities of the first conductivity type into a surface layer of another island through the thin oxide layer to form a base region of a vertical bipolar transistor; forming a thin dielectric layer of the MIS type capacitor on the lower electrode region; and selectively diffusing impurities of the second conductivity type from the surface of the epitaxial layer to form an emitter region of the vertical bipolar transistor to a prescribed depth.

According to a still further aspect of the present invention, a method for manufacturing a semiconductor IC comprises the steps of: preparing a semiconductor substrate of a first conductivity type; forming buried layers of a second conductivity type on desired region of the substrate; forming an epitaxial layer of a second conductivity type over the substrate and the buried layers; forming isolating regions dividing the epitaxial layer into a plurality of islands by selectively diffusing impurities of the first conductivity type into the epitaxial layer; forming a collector low resistance region of a vertical bipolar transistor extending from an upper surface of one of the islands to corresponding one of the buried layers and simultaneously forming a lower electrode region of a MIS type capacitor in another island by selectively diffusing impurities of the second conductivity type into the epitaxial layer; forming a base region of the vertical bipolar transistor by selectively diffusing impurities of the first conductivity type; covering the epitaxial layer with an oxide layer; patterning the oxide layer to expose a portion of the lower electrode region of the MIS type capacitor and depositing a thin dielectric layer thereon; and forming an emitter region of the vertical bipolar transistor by selectively diffusing impurities of the second conductivity type.

According to a still further aspect of the present invention, a semiconductor IC comprises: a semiconductor substrate of a first conductivity type; buried layers of a second conductivity type formed on the substrate; an epitaxial layer of the second conductivity type formed covering the substrate and the buried layers; isolation regions of the second conductivity type dividing the epitaxial layer into a plurality of islands; a collector low resistance region of a vertical bipolar transistor formed such that it extends from an upper surface of one of the islands to corresponding one of the buried layers by selectively diffusing impurities of the second conductivity type into the epitaxial layer; a lower electrode region of a MIS type capacitor formed in another island simultaneously with the collector low resistance region, extending from an upper surface of the same island to corresponding one of the buried layers; a base region of the vertical bipolar transistor formed by selectively diffusing impurities of the first conductivity type; a thin dielectric layer formed on the lower electrode region of the MIS type capacitor; an emitter region of the vertical bipolar transistor formed by selectively diffusing impurities of the second conductivity type; and an upper electrode formed on the thin dielectric layer of the MIS type capacitor.

The foregoing and other objects, features, aspects and advantages of the present invention will become more apparent from the following detailed description of the present invention when taken in conjunction with the accompanying drawings.

BRIEF DESCRIPTION OF THE DRAWINGS

The same reference characters represent corresponding portions throughout the figures.

DESCRIPTION OF THE PREFERRED EMBODIMENTS

FIGS. 2A to 2H illustrate a manufacturing method of a semiconductor IC in accordance with an embodiment of the present invention.

Figure 2A:
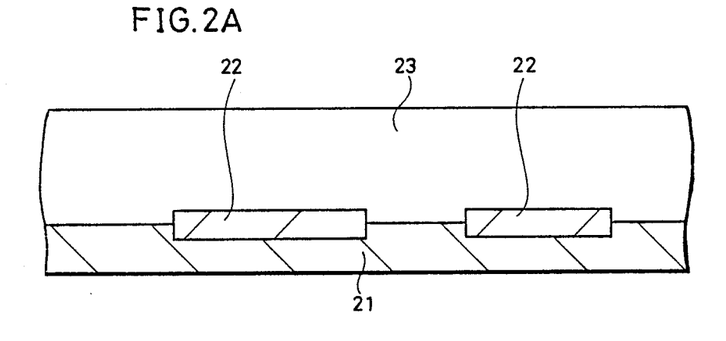
FIGS. 2A to 2H are cross sectional views schematically showing a manufacturing method of a semiconductor IC in accordance with an embodiment of the present invention.

Referring to FIG. 2A, n+ type buried layers 22 are formed in a surface layer of a substrate 21 of a semiconductor such as p type silicon by selectively doping n type impurities such as antimony or arsenic. An n type epitaxial layer 23 having the thickness of 5 μm to 10 μm is grown covering the buried layers 22 and the substrate 21.

Figure 2B:
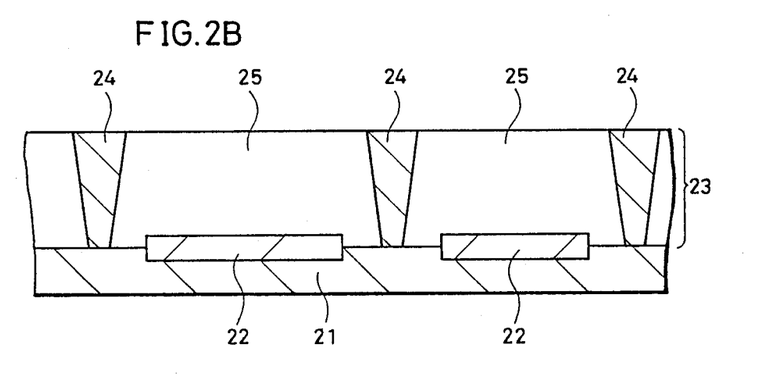

Referring to FIG. 2B, p+ type isolation regions 24 are formed by selectively diffusing boron from a surface of the n type epitaxial layer 23, whereby the epitaxial layer 23 is divided into a plurality of islands 25 by the isolation regions 24.

Figure 2C:
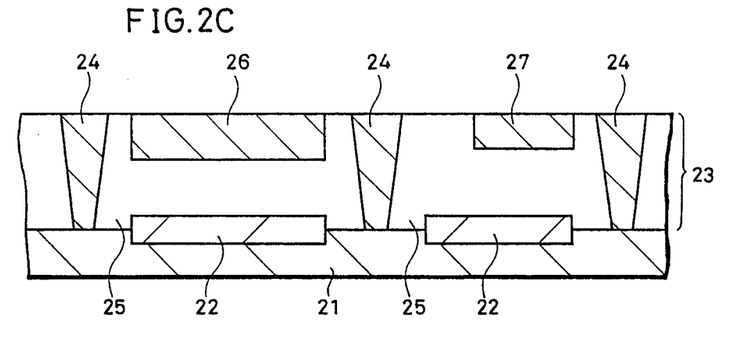

Referring to FIG. 2C, a lower electrode region 26 of a MIS type capacitor is formed by selectively diffusing n type impurities such as phosphorus or antimony, or p type impurities such as boron from a surface of one of the islands 25. A base region 27 of an npn transistor is formed by selectively diffusing or ion-implanting boron from a surface of another island 25. The diffusion of impurities into the lower electrode region 26 and into the base region 27 may be carried out simultaneously or independently. On this occasion, the diffusion depth in the lower electrode region 26 makes no matter. However, in view of the hysteresis of the MIS type capacitor, the lower electrode region should preferably have the high impurity concentration of no less than $10^{18}$ atoms.cm$^{-2}$.

Figure 2D:
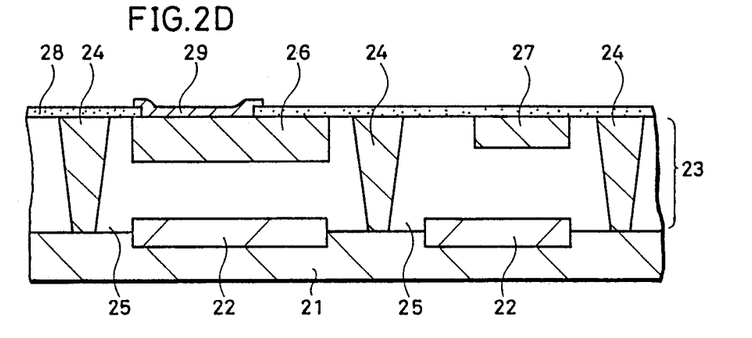

Referring to FIG. 2D, an oxide layer 28 is formed on the surface of the epitaxial layer 23. The oxide layer 28 is selectively etched to expose a portion of the lower electrode region 26. The exposed region of the lower electrode 26 and the oxide layer 28 are covered with a silicon nitride layer having the thickness of several 100 A to 1000 and several 100 A which is deposited by CVD (Chemical Vapor Deposition) method under the normal pressure. A resist pattern is formed on the silicon nitride layer and a thin dielectric layer 29 is formed by dry etching or the like. Since the silicon nitride layer has larger dielectric constant than the silicon oxide layer, a capacitor having a larger capacitance can be formed by using the silicon nitride layer.

Figure 2E:
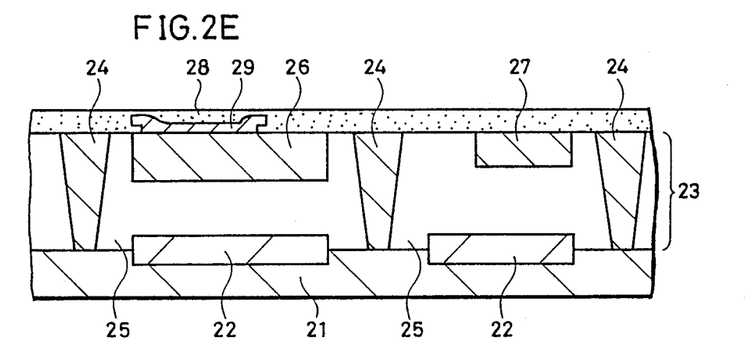

Referring to FIG. 2E, the thin dielectric layer 29 is covered with the oxide layer 28 deposited by the CVD method.

Figure 2F:
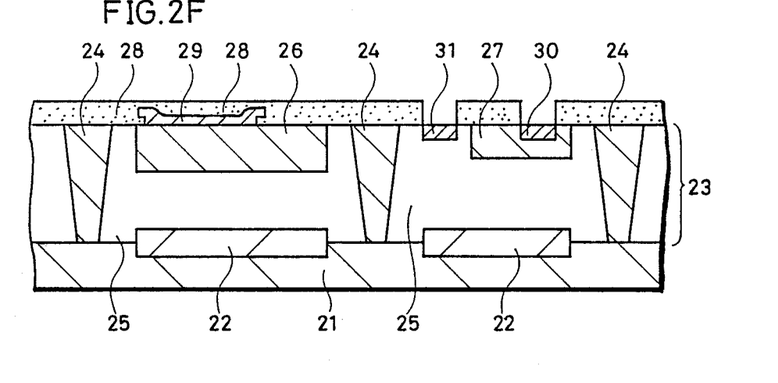

Referring to FIG. 2F, the oxide layer 28 is patterned on a region of that island on which the npn transistor is to be formed. An n+ type emitter region 30 and a collector contact region 31 are formed by diffusing phosphorus in the epitaxial layer 23 with the patterned oxide layer 28 serving as a mask.

Figure 2G:
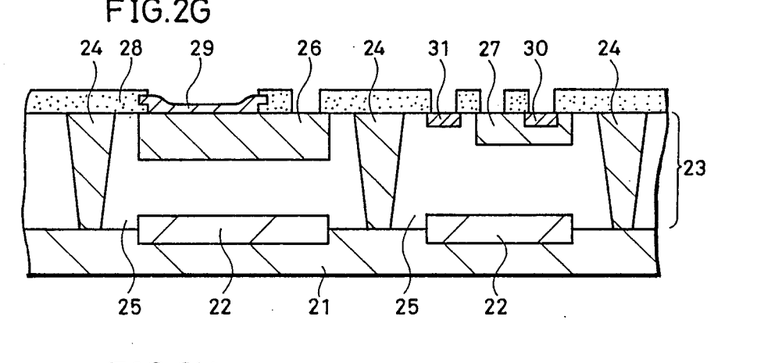

Referring to FIG. 2G, a negative type or positive type photoresist pattern is formed on the oxide layer 28, and the oxide layer 28 is patterned by wet etching or dry etching, using the resist pattern as a mask.

Figure 2H:
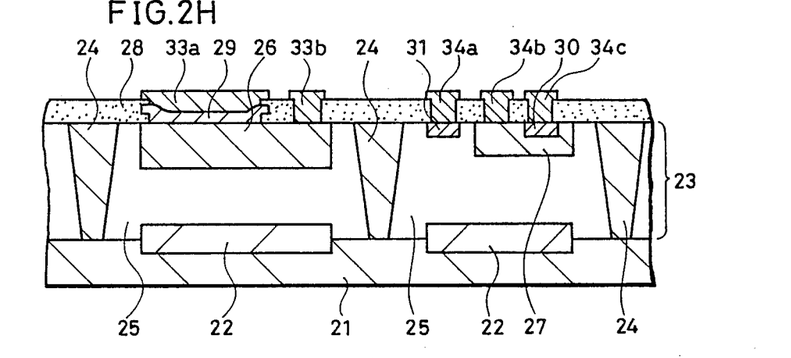

Referring to FIG. 2H, the patterned oxide layer 28 and openings thereof are covered by an aluminum layer deposited by evaporation or sputtering. By patterning the aluminum layer, an upper electrode 33a on the thin dielectric layer 29, an electrical connection 33b connected to the lower electrode region 26, a collector electrode 34a connected to the collector contact region 31, a base electrode 34b connected to the base region 27, and an emitter electrode 34c connected to the emitter region 30 are formed.

In accordance with the above described embodiment, the emitter region 31 is formed after the formation of the thin dielectric layer 29 of silicon nitride layer, so that the emitter region 30 is not affected by the high temperature at which the silicon nitride layer is deposited. Therefore, the current amplification factor $h_{FE}$ of the npn transistor can be accurately controlled. In addition, conditions of heat treatment for diffusing impurities in the emitter region 30 can be constant irrespective of whether the MIS type capacitor is incorporated in the semiconductor IC or not. Namely, semiconductor ICs of different types can be heat treated in the same diffusion furnace.

Figure 3A:
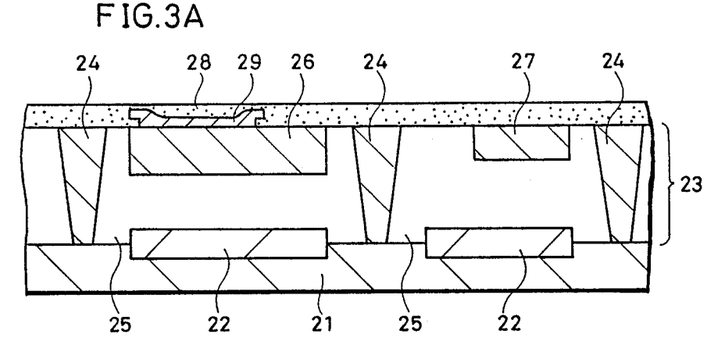
FIGS. 3A to 3C are cross sectional views illustrating another embodiment of the present invention.
Figure 3B:
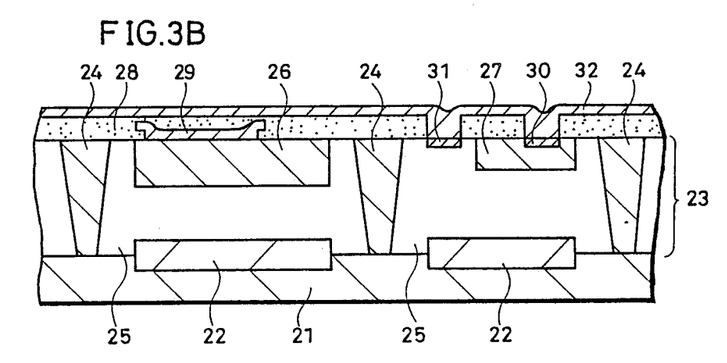
Figure 3C:
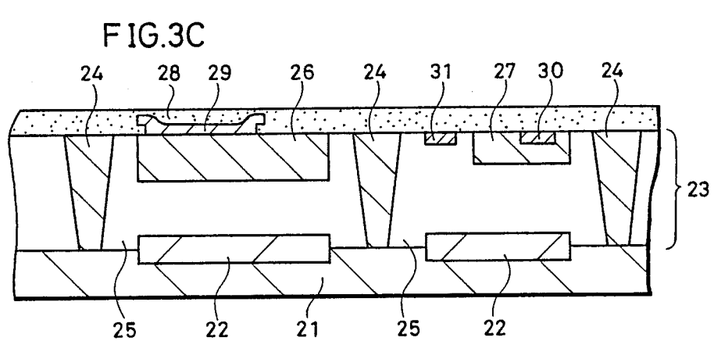

FIGS. 3A to 3C illustrate another embodiment of the present invention. FIG. 3A corresponds to FIG. 2E. In this embodiment, however, a non-doped oxide layer 28 is deposited to the thickness of about 2,000 A by the CVD method under the normal pressure or a reduced pressure on the thin dielectric layer 29 and on the epitaxial layer 23, and the oxide layer 28 is baked at about 800° C.

Referring to FIG. 3B, the oxide layer 28 is patterned on the region of that island on which the npn transistor is to be formed. A liquid source containing phosphorus, for example, is applied by spin-on method to cover the patterned oxide layer 28, and then by baking this, a PSG (Phospho-Silicate Glass) film 32 is formed. Thereafter, the emitter region 30 and the collector contact region 31 of the npn transistors are formed by using the PSG film 32 as a diffusion source. On this occasion, a thin film is formed is on an upper surface of the oxide layer 28 by reaction with the phosphorus in the PSG film 32. However, the thin dielectric layer 29 is not influenced by the phosphorus in the PSG film, since it is protected by the sufficiently thick oxide layer 28. After the emitter region 30 and the collector contact region 31 are formed, the PSG film 32 is removed by means of an etchant of 10% to 30% HF. On this occasion, since the thin layer in the silicon oxide layer 28 reacted with the phosphorus shows almost the same etching rate as the PSG film 32, it is difficult to control the thickness of the oxide layer 28 which is to be left. However, the thin dielectric layer 29 of silicon nitride is hardly etched, so that the etching may be carried out until the thin dielectric layer 29 is exposed.

Referring to FIG. 3C, after the PSG film 32 is removed, the oxide layer 28 which is non-doped or doped with phosphorus is deposited again by the CVD method. Not that thermal oxidation but CVD method is used in this step in order to avoid the fluctuation of the current amplification factor $h_{FE}$ in the heat treatment in an oxidizing atmosphere after the formation of the emitter region 30. However, the oxide layer 28 may be formed by thermal oxidation in some cases depending on circumstances.

Thereafter, the semiconductor IC is finished through the same steps as shown in FIGS. 2G and 2H.

Figure 4A:
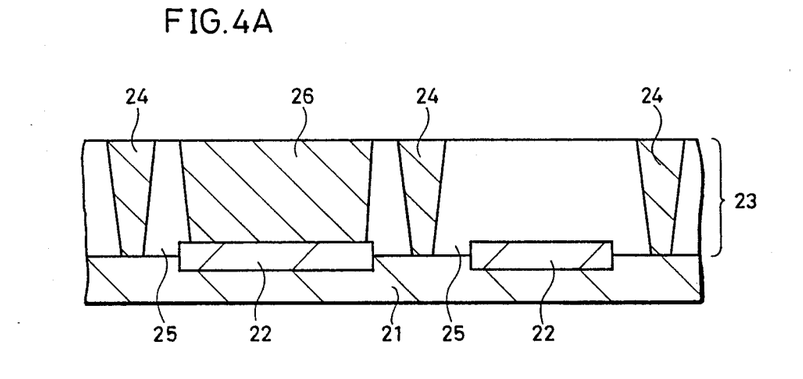
FIGS. 4A and 4B are cross sectional views illustrating a further embodiment of the present invention.
Figure 4B:
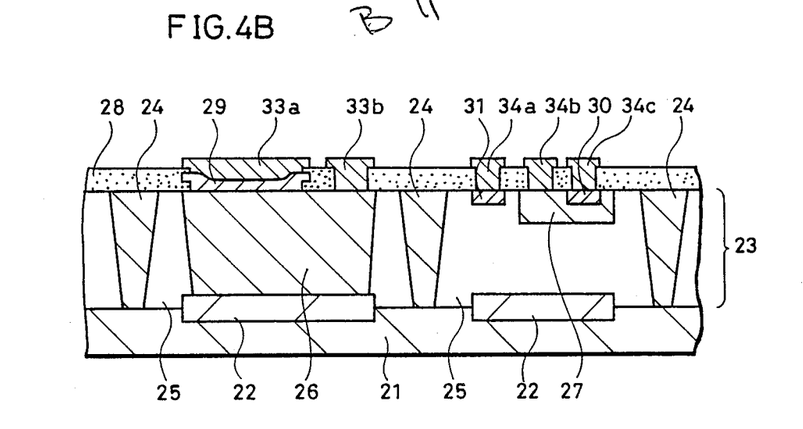

FIGS. 4A and 4B illustrate a further embodiment of the present invention.

Referring to FIG. 4A, after n+ type buried layers 22 and an epitaxial layer 23 are formed on a p type semiconductor substrate 21, p+ type isolation regions 24 are formed by diffusing boron and, simultaneously, a lower electrode region 26 is formed which extends from the top surface of the epitaxial layer 23 to the buried layer 22. The lower electrode region 26 together with the isolation regions 24 is formed by saturation diffusion. Therefore, (the impurity concentration in the surface layer of the lower electrode region 26 becomes about $10^{18}$ atoms.cm$^{-2}$, which is enough for the lower electrode of an MIS type capacitor. The p type lower electrode region 26 is electrically isolated from the p type substrate 21 by the n+ type buried layers 22.

Figure 5A:
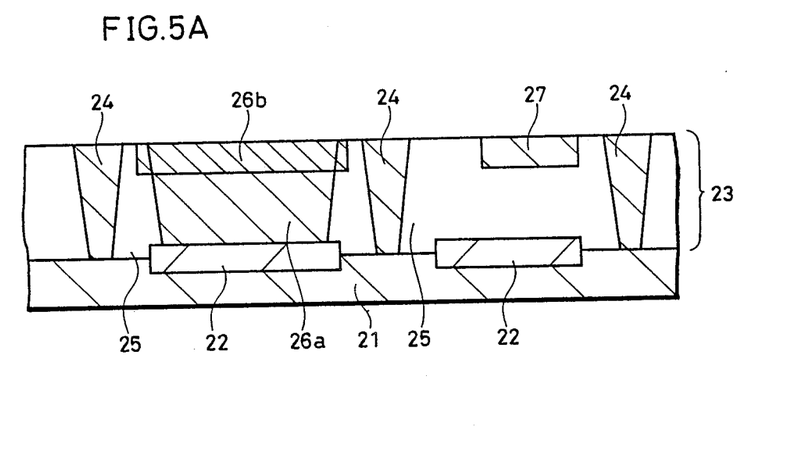
FIGS. 5A and 5B are cross sectional views illustrating a still further embodiment of the present invention.
Figure 5B:
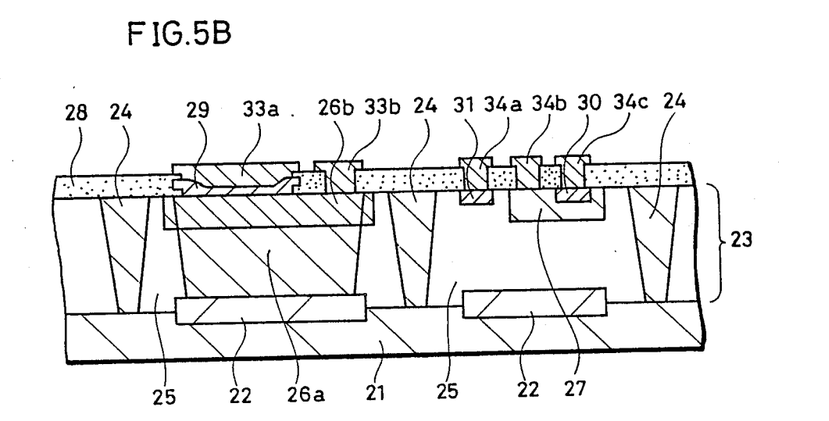

A semiconductor IC as shown in FIG. 4B is finished through the similar steps as shown in FIGS. 2C to 2H. In this embodiment, the lower electrode region 26 is formed utilizing the fundamental manufacturing step for forming the isolation regions 24, whereby the total number of steps can be reduced. FIGS. 5A and 5B illustrate a still further embodiment of the present invention. Referring to FIG. 5A, isolation regions 24 and a first lower electrode region 26a are simultaneously formed by diffusing boron. By selectively ion-implanting or diffusing boron, a base region 27 is formed and, simultaneously, a second lower electrode region 26b overlapping with the surface layer of the first lower electrode layer 26a is formed. Consequently, the impurity concentration in the surface layer of the lower electrode region can be further enhanced, thereby further reducing the electrical resistance.

Thereafter, the similar steps as shown in FIGS. 2D to 2H are carried out and a semiconductor IC as shown in FIG. 5B is finished.

FIGS. 6A to 6E illustrate a still further embodiment of the present invention.

Figure 6A:
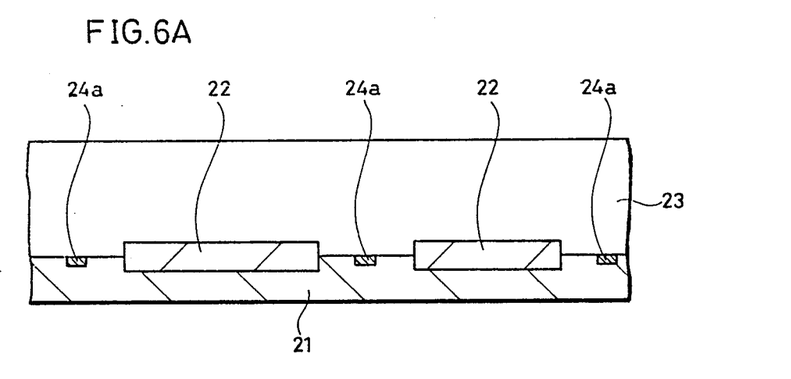
FIGS. 6A to 6E are cross sectional views illustrating a still further embodiment; in progress of stages of completion.

Referring to FIG. 6A, after n+ type buried layers 22 are formed on a p type substrate 21, diffusion seeds 24a containing boron are applied on the substrate 21 so as to surround the buried layers 22, and then an n type epitaxial layer 23 is grown to cover the substrate 21.

Figure 6B:
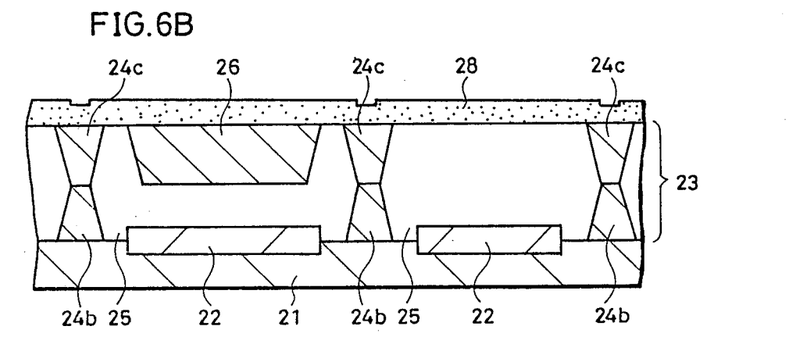

Referring to FIG. 6B, upper isolation regions 24c are formed by selectively diffusing boron from the top surface of the epitaxial layer 23. The upper isolation regions 24c are connected to the lower isolation regions 24b which are simultaneously formed by the diffusion from the seeds 24a. A lower electrode 26 can be formed simultaneously with the upper and lower isolation regions 24c and 24b by selectively diffusing boron. Since the diffusion of boron for forming isolation regions is carried out for a long period of time in an oxidizing atmosphere, a thick oxide layer 28 having the thickness of 5000 A to 8000 A is formed on the epitaxial layer 23. The thick oxide layer 28 is completely removed by 10% HF solution, and the surface of the epitaxial layer 23 is exposed.

Figure 6C:
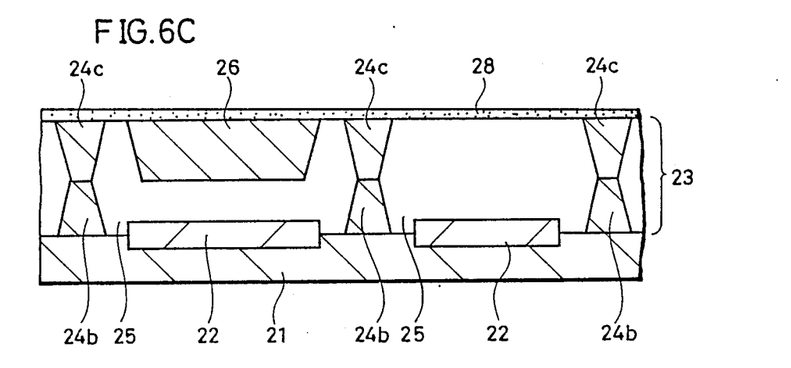

Referring to FIG. 6C, the surface of the exposed epitaxial layer 23 is again thermally oxidized to form a thin oxide layer 28 having a thickness of about several 100 A to 1000 A. Since shallow grooves formed when the boron seeds have been deposited for forming the upper isolation regions are left on the surface of the epitaxial layer 23, shallow grooves correspondingly appear on the surface of the thin oxide layer 28. Therefore, the shallow grooves can be utilized as marks in aligning masks.

Figure 6D:
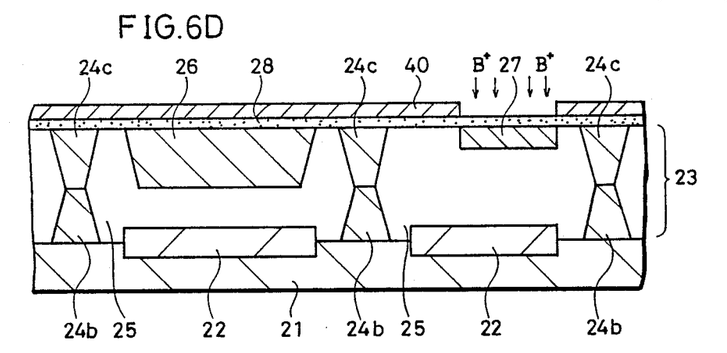

Referring to FIG. 6D, a positive type or negative type photoresist is applied on the oxide layer 28 by spin-on method, and a predetermined resist pattern 40 is formed by exposing and developing the same. Boron ions are implanted in the surface layer of an island 25 through the thin oxide layer 28 to form a base region 27, with the resist pattern 40 serving as a mask. Generation of crystal defects is suppressed when ions are implanted through the thin oxide layer 28, as compared with the ion implantation direct to the exposed epitaxial surface layer. When openings are to be formed precisely by etching a thick oxide layer, expensive devices such as ion reactive etching device are necessary. However, if the oxide layer is thin, no such expensive device is required. The ion implanted base region 27 can be annealed at a later stage utilizing the baking of the oxide layer 28 which will have been made thick by the CVD method. If the oxide layer 28 is made thick by the CVD method and not by thermal oxidation, the impurity concentration at the surface layer of the base region 27 is hardly decreased. Therefore, the impurity concentration can be precisely controlled such that the base region has the resistance value of 200 to 400 Ω/, whereby the current amplification factor $h_{FE}$ can be more accurately controlled.

Figure 6E:
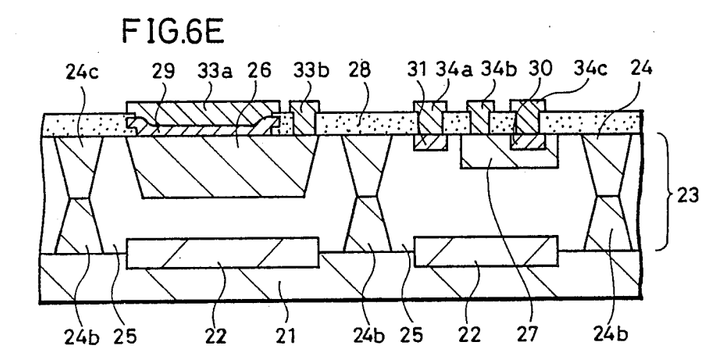

Thereafter, similar steps as shown in FIGS. 2D to 2H are carried out and a semiconductor IC of FIG. 6E is finished.

Figure 7:
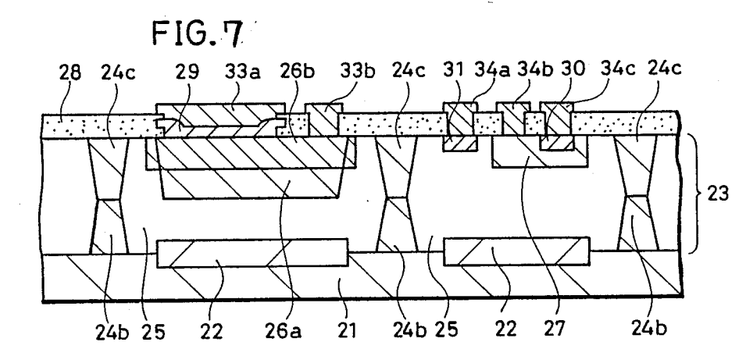
FIG. 7 is a cross sectional view illustrating a still further embodiment.

FIG. 7 illustrates a still further embodiment of the present invention. In this embodiment, in addition to a first lower electrode region 26a which is simultaneously formed with upper and lower isolation regions 24c and 24b, there is provided second lower electrode region 26b which is formed simultaneously with a base region 27.

Figure 8A:
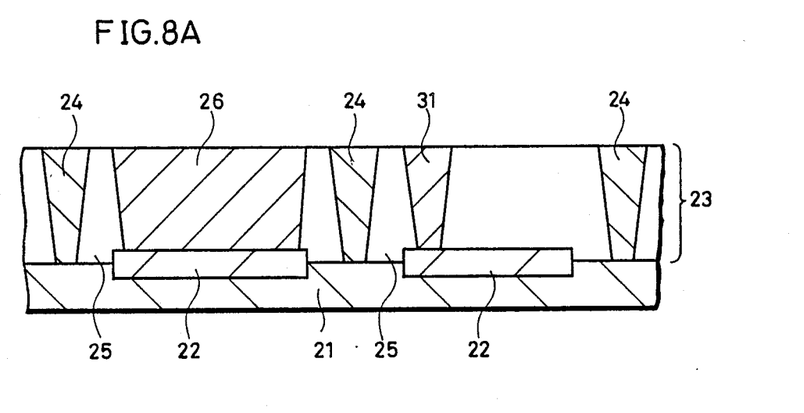
FIGS. 8A and 8B are cross sectional views illustrating a still further embodiment.
Figure 8B:
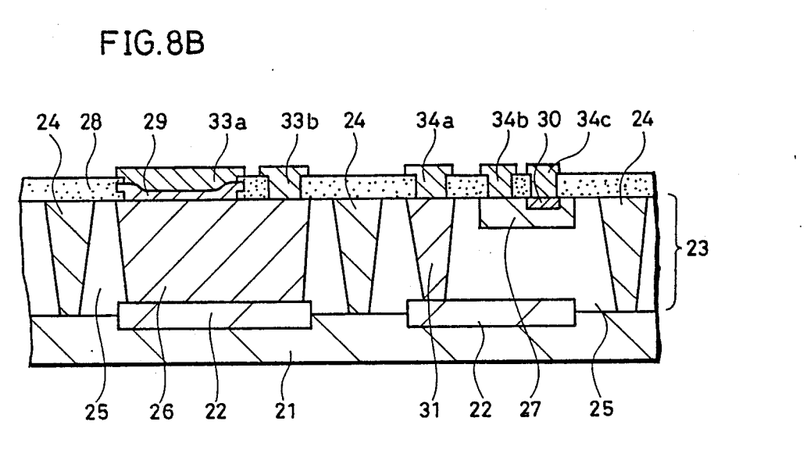

FIGS. 8A and 8B illustrate a still further embodiment of the present invention.

Referring to FIG. 8A, after the steps of FIGS. 2A and 2B, a low resistance region 31 of a collector and a lower electrode region 26 are simultaneously formed to reach corresponding buried layers 22, by selectively diffusing n type impurities such as phosphorus from a surface of an epitaxial layer 23. On this occasion, the lower electrode region 26 is formed by saturation diffusion, so that impurity concentration of the surface layer thereof is about $10^{19}$ atoms.cm$^{-2}$ which is a sufficient value.

A semiconductor I/C as shown in FIG. 8B is finished through the similar steps as shown in FIGS. 2C to 2H. In this embodiment, the lower electrode region 26 is formed utilizing the step of forming the collector low resistance region 31, whereby the total number of steps can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor integrated circuit comprising the steps of:
   preparing a semiconductor substrate of a first conductivity type;

forming buried layers of a second conductivity type on prescribed regions of the substrate;

forming an epitaxial layer of the second conductivity type covering said substrate and said buried layers;

forming isolation regions of the first conductivity type dividing said epitaxial layer into a plurality of islands and simultaneously forming a lower electrode region of a MIS type capacitor in one of said islands;

forming a base region of a vertical bipolar transistor by selectively introducing impurities of the first conductivity type into another island;

covering said epitaxial layer with an oxide layer;

exposing a portion of said lower electrode region by patterning said oxide layer and depositing thereon a dielectric layer of the MIS type capacitor;

further patterning said oxide layer and forming an emitter region of the vertical bipolar transistor by selectively diffusing impurities of the second conductivity type; and forming an upper electrode of the MIS type capacitor on said dielectric layer and forming electrodes which make ohmic contacts through contact holes provided at desired regions in said oxide layer.

2. A method according to claim 1, wherein a second lower electrode region overlapping with a surface layer of said first lower electrode region is formed simultaneously with the formation of said base region.

3. A semiconductor integrated circuit comprising:
a semiconductor substrate of a first conductivity type;
buried layers of a second conductivity type formed on prescribed regions of said substrate;
an epitaxial layer of the second conductivity type formed covering said substrate and said buried layers;
isolation regions of the first conductivity type formed to divide said epitaxial layer into a plurality of islands;
a lower electrode region of an MIS type capacitor formed in one of said islands simultaneously with said isolation regions such that it extends from an upper surface of said one of the islands to corresponding one of said buried layers;
a base region of a vertical bipolar transistor formed by selectively introducing impurities of the first conductivity type into another island;
a thin dielectric layer of the MIS type capacitor formed on a portion of said lower electrode region;
an emitter region of the vertical bipolar transistor formed by selectively diffusing impurities of the second conductivity type; and
an upper electrode formed on the thin dielectric layer of the MIS type capacitor.

4. A semiconductor integrated circuit according to claim 3, further comprising a second lower electrode region formed simultaneously with said base region and overlapping with a surface layer of said first lower electrode region.

5. A method for manufacturing a semiconductor integrated circuit comprising the steps of:
preparing a semiconductor substrate of a first conductivity type;
forming buried layers of a second conductivity type on prescribed regions of the substrate;
forming an epitaxial layer of the second conductivity type to cover said substrate and said buried layers;

forming isolation regions of the first conductivity type dividing said epitaxial layer into a plurality of islands and simultaneously forming a lower electrode region of an MIS type capacitor on one of said islands;

exposing said epitaxial layer by removing a thick thermal oxide layer inevitably formed on said epitaxial layer when forming said isolation regions, and again forming a thin thermal oxide layer on said surface of said epitaxial layer;

implanting impurity ions of the first conductivity type into another island through said thin oxide layer in order to form a base region of a vertical bipolar transistor;

forming a thin dielectric layer of the MIS type capacitor on said lower electrode region; and forming an emitter region of the vertical bipolar transistor to a prescribed thickness by selectively diffusing impurities of the second conductivity type into said epitaxial layer.

6. A method according to claim 5, wherein lower regions of said isolation regions are formed by diffusion from impurity seeds provided on said substrate to surround said buried layers, and upper regions of said isolation regions are formed by diffusion from impurity seeds applied on an upper surface of said epitaxial layer.

7. A method according to claim 5, wherein a second lower electrode region overlapping with a surface layer of said first lower electrode region is formed simultaneously with the formation of said base region.

8. A method for manufacturing a semiconductor integrated circuit comprising the steps of:
preparing a semiconductor substrate of a first conductivity type;
forming buried layers of a second conductivity type on prescribed regions of the substrate;
forming an epitaxial layer of the second conductivity type covering said substrate and said buried layers;
forming isolating regions dividing said epitaxial layer into a plurality of islands by selectively diffusing impurities of the first conductivity type into said epitaxial layer;
forming a collector low resistance region of a vertical bipolar transistor extending from an upper surface of one of said islands to corresponding one of said buried layers by selectively diffusing impurities of the second conductivity type from an upper surface of said epitaxial layer and simultaneously forming a lower electrode region of an MIS type capacitor in another island;
forming a base region of the vertical bipolar transistor by selectively diffusing impurities of the first conductivity type into said one of the islands;
covering said epitaxial layer by an oxide layer;
exposing a portion of said lower electrode region by patterning said oxide layer and depositing thereon a thin dielectric layer of an MIS type capacitor;
forming an emitter region of the vertical bipolar transistor by further patterning said oxide layer and by selectivity diffusing impurities of the second conductivity type into said one of the islands; and
forming an upper electrode of the MIS type capacitor on said thin dielectric layer and forming an electrode on a desired region which makes an ohmic contact through a contact hole provided in said oxide layer.

* * * * *